US012603656B2

(12) United States Patent
Sun et al.

(10) Patent No.: US 12,603,656 B2
(45) Date of Patent: Apr. 14, 2026

(54) PHASE INTERPOLATOR CIRCUITRY WITH POST-DISTORTION LINEARIZATION

(71) Applicant: Apple Inc., Cupertino, CA (US)

(72) Inventors: Bo Sun, Carlsbad, CA (US); Brian S Leibowitz, San Francisco, CA (US); Sanjeev K Maheshwari, Fremont, CA (US); Jafar Savoj, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 136 days.

(21) Appl. No.: 18/426,208

(22) Filed: Jan. 29, 2024

(65) Prior Publication Data

US 2025/0247102 A1 Jul. 31, 2025

(51) Int. Cl.
H03L 7/099 (2006.01)
H03L 7/081 (2006.01)
H03L 7/083 (2006.01)

(52) U.S. Cl.
CPC .......... H03L 7/0998 (2013.01); H03L 7/0818 (2013.01); H03L 7/083 (2013.01)

(58) Field of Classification Search
None
See application file for complete search history.

(56) References Cited

U.S. PATENT DOCUMENTS 6,470,483 B1 10/2002 Rodriguez et al.
6,731,168 B2 * 5/2004 Hedberg ............... H03F 1/3294
330/289

6,801,066 B2 * 10/2004 Lee ........................ H04L 7/0337
327/119
7,046,058 B1 * 5/2006 Fang ..................... H03L 7/0818
327/158
7,436,229 B2 * 10/2008 Sidiropoulos ........... H03L 7/081
327/147
7,634,039 B2 * 12/2009 Maneatis .................. H03L 7/08
375/376
8,359,445 B2 1/2013 Ware et al.
8,373,472 B2 * 2/2013 Thaller .................... H03L 7/183
327/158

(Continued)

FOREIGN PATENT DOCUMENTS

CN 101888243 A * 11/2010 ............. H03L 7/085
CN 102437822 A * 5/2012

(Continued)

*Primary Examiner* — Berhanu Tadese
(74) *Attorney, Agent, or Firm* — Fletcher Yoder, PC

(57) ABSTRACT

The current disclosure is directed to a phase interpolator (PI) with phase correction circuitry. The phase interpolator may generate a clock signal with a phase value. The phase correction circuitry may adjust the phase value of the clock signal to compensate for at least a portion of the undesired distortions. The phase correction circuitry may store predetermined delay values to at least partially compensate for the undesired distortions of the clock signal based on the control signals. The phase correction circuitry may output the clock signal, as adjusted, with improved phase value accuracy and/or clock signal linearity. In some cases, the phase correction circuitry may improve operations of the phase interpolator, or an electronic system including the phase interpolator, across variations in process, voltage, and/or temperature.

20 Claims, 6 Drawing Sheets

(56) References Cited

U.S. PATENT DOCUMENTS

| | | | | |
|---|---|---|---|---|
| 8,537,041 | B2 * | 9/2013 | Chandrasekaran | H03F 3/24 341/142 |
| 8,554,012 | B2 * | 10/2013 | Du | H04N 1/387 382/254 |
| 8,674,773 | B2 * | 3/2014 | Nedovic | H03L 7/0995 327/159 |
| 8,867,685 | B2 * | 10/2014 | Maneatis | H03L 7/08 375/376 |
| 9,184,909 | B1 * | 11/2015 | McCracken | H04L 7/042 |
| 9,210,009 | B2 * | 12/2015 | Pashay-Kojouri | H04L 25/49 |
| 9,485,082 | B1 * | 11/2016 | Sun | H03L 7/0807 |
| 9,537,475 | B1 * | 1/2017 | Iorga | H03K 5/135 |
| 9,608,611 | B1 | 3/2017 | Hearne et al. | |
| 10,128,826 | B2 * | 11/2018 | Jin | H03K 5/1252 |
| 10,263,628 | B2 * | 4/2019 | Pagnanelli | H03L 7/191 |
| 10,498,343 | B2 * | 12/2019 | Sjoland | H03L 7/085 |
| 10,498,345 | B1 * | 12/2019 | Rakshit | H03L 7/083 |
| 10,536,259 | B1 | 1/2020 | Kenyon | |
| 10,541,737 | B2 * | 1/2020 | Sjöland | H04B 7/0617 |
| 10,560,104 | B2 * | 2/2020 | Li | H04L 7/0025 |
| 10,686,584 | B2 * | 6/2020 | Tajalli | H04L 7/0025 |
| 10,720,936 | B1 * | 7/2020 | Xu | H03M 1/204 |
| 10,735,176 | B1 * | 8/2020 | Heydari | H04L 7/0008 |
| 10,931,295 | B2 * | 2/2021 | Xu | H03M 1/204 |
| 11,115,040 | B1 * | 9/2021 | Xu | H03M 1/121 |
| 11,190,203 | B2 * | 11/2021 | Xu | H03M 1/204 |
| 11,368,143 | B1 * | 6/2022 | Chakraborty | G06F 1/08 |
| 11,489,540 | B2 * | 11/2022 | Xu | H03M 1/1215 |
| 11,525,715 | B2 * | 12/2022 | Krall | G01D 3/02 |
| 11,695,425 | B2 * | 7/2023 | Xu | H03M 1/1245 341/161 |
| 11,909,853 | B2 * | 2/2024 | Hazra | H04L 7/0337 |
| 2002/0113660 | A1 * | 8/2002 | Dally | H03L 7/0818 331/135 |
| 2003/0067333 | A1 * | 4/2003 | Nakamura | H04L 7/0337 327/158 |
| 2004/0012453 | A1 * | 1/2004 | Dally | H03L 7/0805 331/135 |
| 2005/0024117 | A1 | 2/2005 | Kubo et al. | |
| 2005/0231291 | A1 * | 10/2005 | Dally | H03L 7/07 331/16 |
| 2006/0214742 | A1 * | 9/2006 | Dally | H03L 7/20 331/167 |
| 2009/0015340 | A1 * | 1/2009 | Dally | H03L 7/083 331/172 |
| 2010/0086094 | A1 * | 4/2010 | Maneatis | H03L 7/0812 375/376 |
| 2012/0194238 | A1 * | 8/2012 | Maneatis | H03L 7/089 327/157 |
| 2013/0154700 | A1 * | 6/2013 | Maneatis | H03L 7/0896 327/157 |
| 2014/0362962 | A1 * | 12/2014 | Meier | H04L 7/033 375/375 |
| 2017/0019112 | A1 * | 1/2017 | Li | H04L 7/0012 |
| 2018/0115410 | A1 * | 4/2018 | Tajalli | H03L 7/0998 |
| 2018/0205370 | A1 * | 7/2018 | Jin | H03L 7/091 |
| 2021/0028791 | A1 * | 1/2021 | Xu | H03M 1/121 |
| 2021/0143830 | A1 * | 5/2021 | Xu | H03M 1/121 |
| 2021/0391853 | A1 | 12/2021 | Jann et al. | |
| 2022/0140837 | A1 * | 5/2022 | Xu | H03M 1/121 341/161 |
| 2023/0020651 | A1 * | 1/2023 | Xu | H03M 1/1245 |
| 2023/0155595 | A1 * | 5/2023 | Huang | H03L 7/093 375/376 |
| 2023/0198732 | A1 * | 6/2023 | Hazra | H04L 7/0025 |
| 2025/0247102 | A1 * | 7/2025 | Sun | H03L 7/0998 |

FOREIGN PATENT DOCUMENTS

| | | | | | |
|---|---|---|---|---|---|
| CN | 102843134 | A | * | 12/2012 | H03L 7/183 |
| CN | 102946248 | A | * | 2/2013 | H03L 7/0816 |
| CN | 103609018 | A | * | 2/2014 | H03F 1/3247 |
| CN | 103701438 | A | * | 4/2014 | H03H 7/06 |
| CN | 104052436 | A | * | 9/2014 | H03K 3/012 |
| CN | 104065376 | A | * | 9/2014 | H03L 7/081 |
| CN | 101888243 | B | * | 9/2015 | H03L 7/0802 |
| CN | 102843134 | B | * | 9/2015 | H03L 7/183 |
| CN | 104967449 | A | * | 10/2015 | H03L 7/1976 |
| CN | 103609018 | B | * | 12/2015 | H03F 1/3247 |
| CN | 105119598 | A | * | 12/2015 | H03L 7/085 |
| CN | 103701438 | B | * | 7/2016 | H03H 7/06 |
| CN | 105786746 | A | * | 7/2016 | H03L 7/0807 |
| CN | 102946248 | B | * | 8/2016 | H03L 7/0816 |
| CN | 104052436 | B | * | 7/2017 | H03K 4/92 |
| CN | 107070414 | A | * | 8/2017 | H03G 3/3036 |
| CN | 108336994 | A | * | 7/2018 | H03L 7/1976 |
| CN | 104967449 | B | * | 10/2018 | H03L 7/1976 |
| CN | 108336994 | B | * | 7/2019 | H03L 7/0991 |
| CN | 105786746 | B | * | 9/2019 | H03L 7/07 |
| CN | 111295842 | A | * | 6/2020 | H03K 23/68 |
| CN | 117036506 | A | * | 11/2023 | G06T 7/80 |
| CN | 117036506 | B | * | 5/2024 | G06T 7/80 |
| DE | 102012210405 | A1 | * | 12/2012 | H03L 7/183 |
| DE | 102013110222 | A1 | * | 3/2014 | H03H 7/06 |
| DE | 102014108156 | A1 | * | 12/2014 | H04L 7/0337 |
| DE | 102013110222 | B4 | * | 10/2015 | H03H 7/06 |
| EP | 1013077 | B1 | * | 2/2003 | H04N 3/2335 |
| EP | 0869672 | B1 | * | 5/2003 | H01Q 5/50 |
| EP | 3043477 | A2 | * | 7/2016 | H04L 25/14 |
| EP | 3043477 | B1 | * | 4/2018 | H03L 7/0807 |
| EP | 3394985 | B1 | * | 7/2019 | H04B 7/0617 |
| EP | 3440775 | B1 | * | 11/2019 | H03L 7/087 |
| JP | 2000278190 | A | * | 10/2000 | |
| JP | 2006211701 | A | * | 8/2006 | |
| JP | 2010035015 | A | * | 2/2010 | H03L 7/18 |
| KR | 20040107116 | A | * | 12/2004 | |
| KR | 20080022451 | A | * | 3/2008 | H03L 7/08 |
| KR | 20220144481 | A | * | 10/2022 | G11C 7/222 |
| RU | 2005114019 | A | * | 1/2006 | H03F 1/3247 |
| TW | 202315325 | A | * | 4/2023 | G06F 1/10 |
| TW | 202345532 | A | * | 11/2023 | H04B 15/04 |
| WO | WO-2004100380 | A1 | * | 11/2004 | H03L 1/022 |
| WO | WO-2012154441 | A1 | * | 11/2012 | H03F 1/3247 |
| WO | WO-2013040465 | A1 | * | 3/2013 | H04L 25/03343 |
| WO | WO-2017108100 | A1 | * | 6/2017 | H04B 7/0617 |
| WO | WO-2017174142 | A1 | * | 10/2017 | H04L 7/0331 |
| WO | WO-2022175068 | A1 | * | 8/2022 | G06F 1/08 |
| WO | WO-2025049140 | A1 | * | 3/2025 | H03K 5/26 |

* cited by examiner

128

RECEIVE
MULTIPLE OUT-OF-PHASE
REFERENCE CLOCK SIGNALS — 130

RECEIVE CONTROL
SIGNALS INDICATIVE OF A
DESIRED PHASE VALUE OF
AN OUTPUT CLOCK SIGNAL — 132

GENERATE THE
OUTPUT CLOCK SIGNAL BY
COMBINING THE REFERENCE
CLOCK SIGNALS BASED
ON THE CONTROL SIGNALS — 134

ADJUST THE PHASE VALUE OF
THE OUTPUT CLOCK SIGNAL — 136

OUTPUT THE ADJUSTED
OUTPUT CLOCK SIGNAL — 138

PHASE INTERPOLATOR CIRCUITRY WITH POST-DISTORTION LINEARIZATION

BACKGROUND

The present disclosure relates generally to clock generation circuitry of an electronic device. The clock generation circuitry outputs a clock signal including electrical pulses at regular intervals corresponding to a desired oscillation frequency. The electronic device may perform operations based on the clock signal. The electronic device may communicate data by synchronizing the data with the oscillation frequency of the electrical pulses of the clock signal. For example, the electronic device may communicate data between various electrical components disposed therein, output data to other devices, and/or receive input data by synchronizing the data with the clock signal. As such, improving a timing for outputting the electrical pulses of the clock signal based on the regular intervals (e.g., the desired oscillation frequency) may be desirable.

SUMMARY

The current disclosure is directed to a phase interpolator (PI) with phase correction circuitry. The phase interpolator may generate a clock signal with a phase value based on receiving control signals. The control signals may be indicative of the phase value of the clock signal. In some cases, if not compensated for, variations in process, voltage, and/or temperature of the phase interpolator, or an electronic system including the phase interpolator, may undesirably distort the phase of the clock signal. The phase correction circuitry may adjust the phase value of the clock signal to compensate for at least a portion of the undesired distortions.

In particular, the phase correction circuitry may receive the control signals and the clock signal. The phase correction circuitry may store pre-determined delay values to compensate for the undesired distortions of the clock signal based on the control signals. For example, a pre-determined delay value may at least partially compensate for distortions of a phase value of the clock signal. As mentioned above, the phase value of the clock signal may be indicated by the control signals.

The phase correction circuitry may adjust (e.g., delay) the clock signal by a pre-determined delay value. The delay values may be predetermined during manufacturing, determined by calibration of the phase interpolator after manufacturing, or both. For example, the electronic system may dynamically determine the delay values based on receiving clock calibration instructions, based on a time interval, based on detecting a change in voltage and/or temperature of the phase interpolator higher than a threshold, among other things.

The phase correction circuitry may output the clock signal, as adjusted, with improved phase value accuracy and/or clock signal linearity. In some cases, the phase correction circuitry may improve operations of the phase interpolator, or the electronic system including the phase interpolator, across variations in process, voltage, and/or temperature. The improved phase value of the clock signal may improve time-synchronization of the clock signal with data being clocked by the clock signal, improve signal integrity of the clock signal, improve signal integrity of the data being clocked by the clock signal, and/or improve system performance of the electronic system including the phase interpolator, or any combination thereof, among other things.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
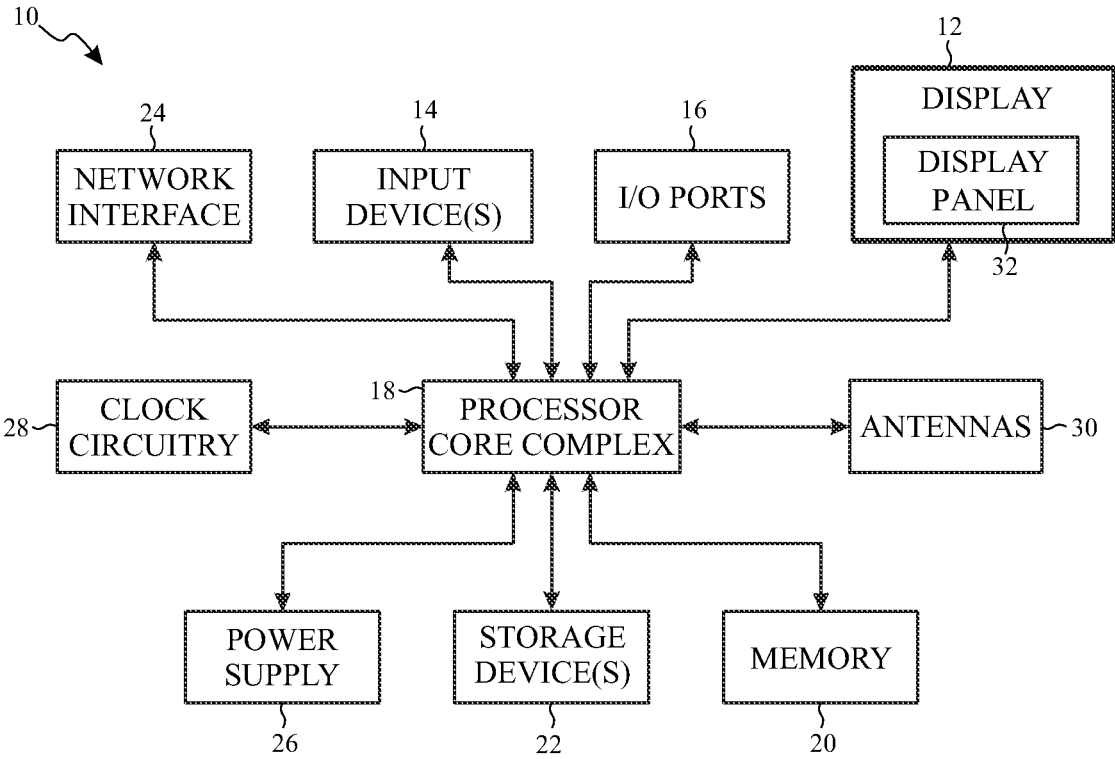
FIG. 1 is a block diagram of an electronic device including clock circuitry, according to embodiments of the present disclosure.

FIG. 1 is a block diagram of an electronic device 10 including an electronic display 12, according to embodiments of the present disclosure. As is described in more detail below, the electronic device 10 may be any suitable electronic device, such as a computer, a mobile phone, a portable media device, a tablet, a television, a virtual-reality headset, a wearable device such as a watch, a vehicle dashboard, or the like. Thus, it should be noted that FIG. 1 is merely one example of a particular implementation and is intended to illustrate the types of components that may be present in an electronic device 10.

The electronic device 10 includes the electronic display 12, one or more input devices 14, one or more input/output (I/O) ports 16, a processor core complex 18 having one or more processing circuitry(s) or processing circuitry cores, local memory 20, a main memory storage device 22, a network interface 24, a power source 26 (e.g., power supply), clock circuitry 28, and one or more antennas 30. The various components described in FIG. 1 may include hardware elements (e.g., circuitry), software elements (e.g., a tangible, non-transitory computer-readable medium storing executable instructions), or a combination of both hardware and software elements. It should be noted that the various depicted components may be combined into fewer components or separated into additional components. For example, the local memory 20 and the main memory storage device 22 may be included in a single component.

The processor core complex 18 is operably coupled with local memory 20 and the main memory storage device 22. Thus, the processor core complex 18 may execute instructions stored in local memory 20 and/or the main memory storage device 22 to perform operations, such as generating or transmitting image data to display on the electronic display 12. As such, the processor core complex 18 may include one or more general purpose microprocessors, one or more application specific integrated circuits (ASICs), one or more field programmable logic arrays (FPGAs), or any combination thereof.

In addition to program instructions, the local memory 20 or the main memory storage device 22 may store data to be processed by the processor core complex 18. Thus, the local memory 20 and/or the main memory storage device 22 may include one or more tangible, non-transitory, computer-readable media. For example, the local memory 20 may include random access memory (RAM) and the main memory storage device 22 may include read-only memory (ROM), rewritable non-volatile memory such as flash memory, hard drives, optical discs, or the like.

The network interface 24 may communicate data with another electronic device or a network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, or a wide area network (WAN), such as a 4G, Long-Term Evolution (LTE), or 5G cellular network.

The power source 26 may provide electrical power to one or more components in the electronic device 10, such as the processor core complex 18 or the electronic display 12. For example, the power source 26 may include a power supply rail and/or a ground terminal coupled to the one or more components in the electronic device 10, such as the processor core complex 18 or the electronic display 12, to provide the electrical power. Thus, the power source 26 may include any suitable source of energy, such as a rechargeable lithium polymer (Li-poly) battery or an alternating current (AC) power converter.

The clock circuitry 28 may include circuitry to generate a clock signal oscillating at a desired frequency and having a desired phase value. The clock circuitry 28 may generate the clock signal with improved phase value accuracy compared to clock signals generated by other clock circuitry, as will be discussed in more details below. In some embodiments, the display 12, the processor core complex 18, the memory 20, the storage devices 22, among other possibilities, may receive the clock signal. For example, the processor core complex 18 may clock-in (e.g., input) input data, clock-out (e.g., output) the input data, and/or perform processing operations on the input data using the clock signal. The input data may include image data, communication data, among other data.

The I/O ports 16 may enable the electronic device 10 to interface with other electronic devices. For example, when a portable storage device is connected, the I/O port 16 may enable the processor core complex 18 to communicate data with the portable storage device. The input devices 14 may enable user interaction with the electronic device 10, for example, by receiving user inputs via a button, a keyboard, a mouse, a trackpad, or the like. The input device 14 may include touch-sensing components in the electronic display 12. The touch sensing components may receive user inputs by detecting occurrence or position of an object touching the surface of the electronic display 12.

The electronic display 12 may include driver circuitry (e.g., display driver circuitry) and/or a display panel 32. The display panel 32 may include pixel circuitry with an array of display pixels. Moreover, the driver circuitry may include various circuitry to provide one or more stable positive and/or negative supply voltages, such the power supply rail and/or the ground terminal. Image data for display on the electronic display 12 may be generated by an image source, such as the processor core complex 18, a graphics processing unit (GPU), or an image sensor. Additionally, in some embodiments, image data may be received from another electronic device 10, for example, via the network interface 24 and/or an I/O port 16. Similarly, the electronic display 12 may display frames based on image data generated by the processor core complex 18, or the electronic display 12 may display frames based on image data received via the network interface 24, an input device, or an I/O port 16.

Figures 2, 3:
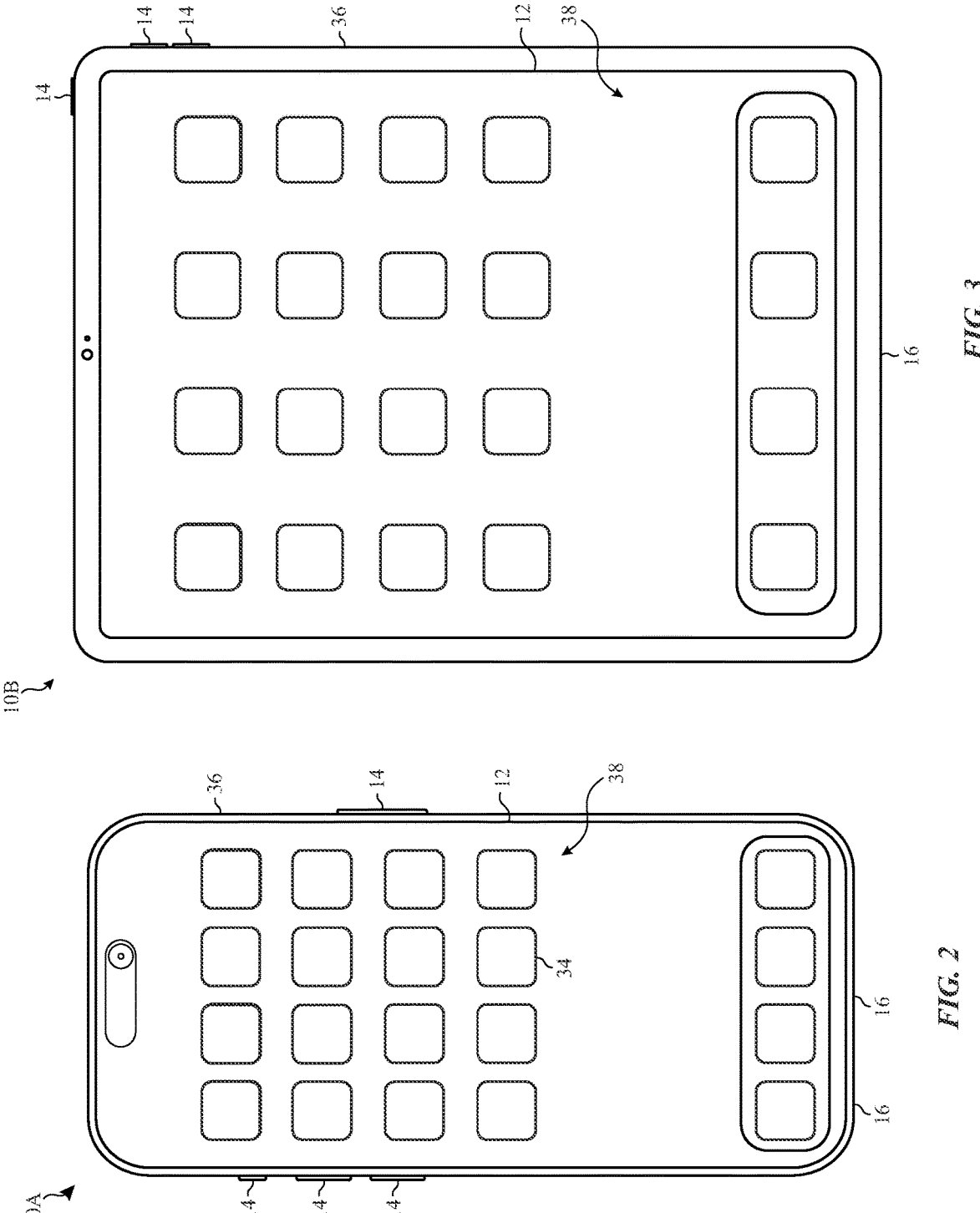
FIG. 2 is a front view of a handheld device representing an example of the electronic device of FIG. 1, according to embodiments of the present disclosure.
FIG. 3 is a front view of another handheld device representing another example of the electronic device of FIG. 1, according to embodiments of the present disclosure.

The electronic device 10 may also have the one or more antennas 30 electrically coupled to the processor core complex 18. The electronic device 10 may be any suitable electronic device. To help illustrate, an example of the electronic device 10, a handheld device 10A, is shown in FIG. 2. The handheld device 10A may be a portable phone, a media player, a personal data organizer, a handheld game platform, or the like. For illustrative purposes, the handheld device 10A may be a smart phone, such as any IPHONE® model available from Apple Inc.

The handheld device 10A includes an enclosure 36 (e.g., housing). The enclosure 36 may protect interior components from physical damage or shield them from electromagnetic interference, such as by surrounding the electronic display 12. The electronic display 12 may display a graphical user interface (GUI) 38 having an array of icons. When an icon 34 is selected either by an input device 14 or a touch-sensing component of the electronic display 12, an application program may launch.

The input devices 14 may be accessed through openings in the enclosure 36. The input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, or toggle between vibrate and ring modes.

Figure 4:
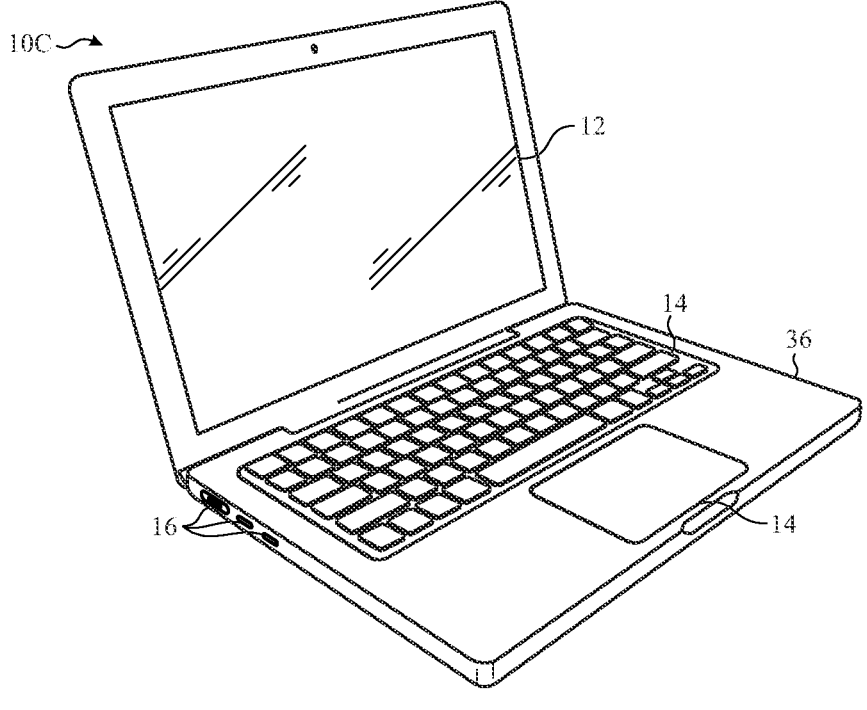
FIG. 4 is a perspective view of a notebook computer representing an example of the electronic device of FIG. 1, according to embodiments of the present disclosure.

Another example of a suitable electronic device 10, specifically a tablet device 10B, is shown in FIG. 3. The tablet device 10B may be any IPAD® model available from Apple Inc. A further example of a suitable electronic device 10, specifically a computer 10C, is shown in FIG. 4. For illustrative purposes, the computer 10C may be any MAC-BOOK® or IMAC® model available from Apple Inc.

Figure 5:
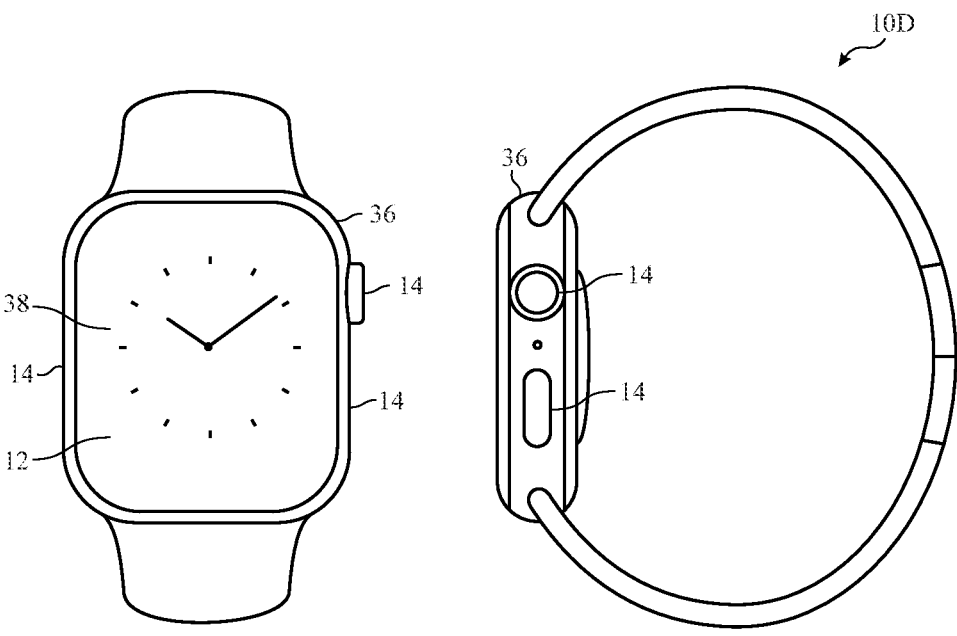
FIG. 5 illustrates front and side views of a wearable electronic device representing another example of the electronic device of FIG. 1, according to embodiments of the present disclosure.

Another example of a suitable electronic device 10, specifically a watch 10D, is shown in FIG. 5. For illustrative purposes, the watch 10D may be any APPLE WATCH® model available from Apple Inc.

As depicted, the tablet device 10B, the computer 10C, and the watch 10D each also includes an electronic display 12, input devices 14, I/O ports 16, and an enclosure 36. The electronic display 12 may display a GUI 38. As shown in FIG. 5, the GUI 38 may show a visualization of a clock. When the visualization is selected either by the input device 14 or a touch-sensing component of the electronic display 12, an application program may launch, such as to transition the GUI 38 to presenting the icons 34 discussed with respect to FIGS. 2 and 3.

Figure 6:
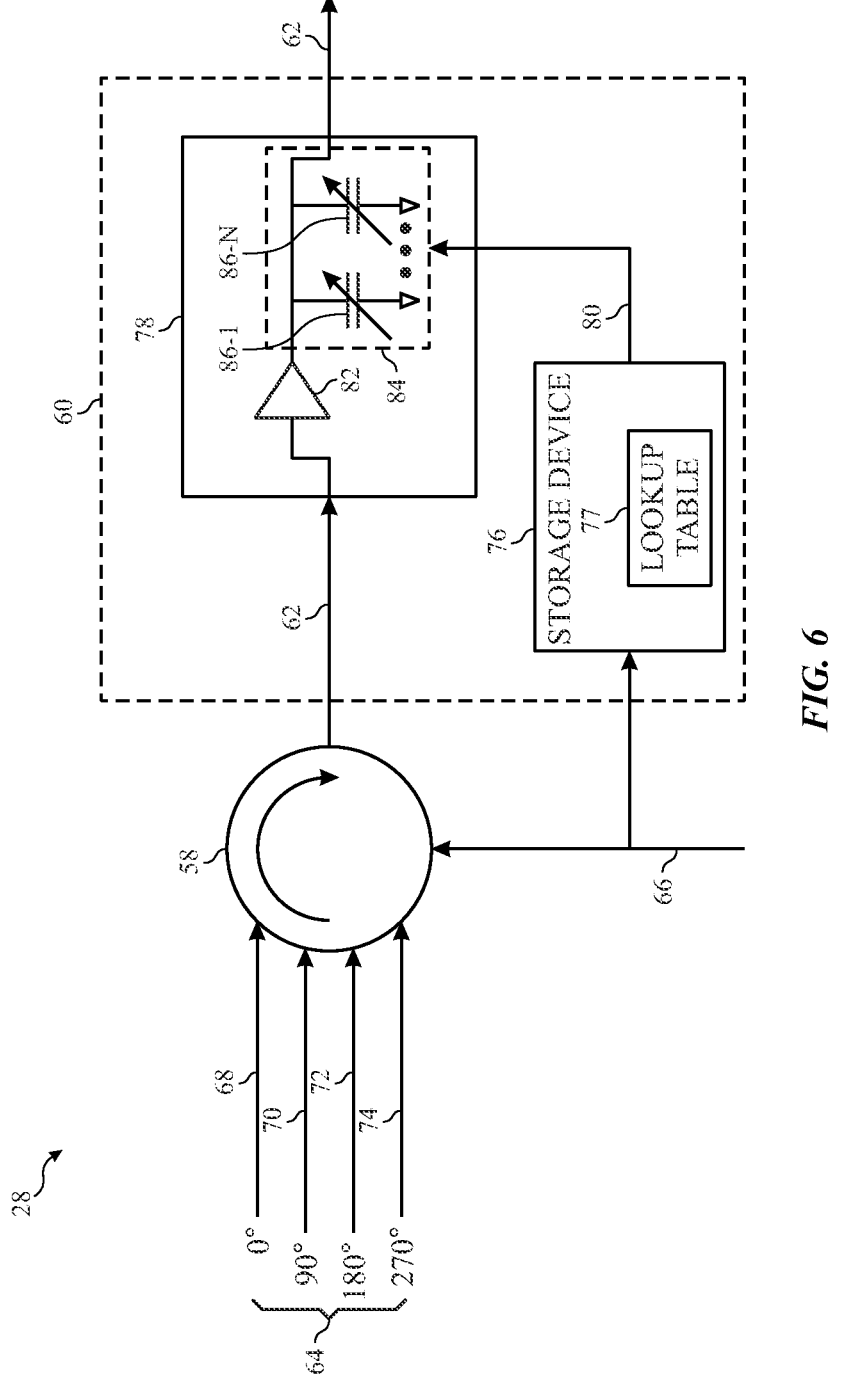
FIG. 6 is a schematic diagram of a portion of clock circuitry of the electronic device of FIG. 1 to generate an output clock signal with a desired phase value, according to embodiments of the present disclosure.

FIG. 6 is a schematic diagram of a portion of the clock circuitry 28, according to embodiments of the present disclosure. In some embodiments, the electronic device 10 discussed above may include the clock circuitry 28. The clock circuitry 28 may include a phase interpolator 58 and a phase correction circuit 60. The phase correction circuit 60 may be coupled to an output of the phase interpolator 58. The phase interpolator 58 may generate an output clock signal 62 with a desired phase value. In some cases, the phase correction circuit 60 may adjust (e.g., delay) the output clock signal 62 to improve an accuracy of the desired phase value and/or linearity of the output clock signal 62, as will be appreciated.

The phase interpolator 58 may receive multiple reference clock signals 64 and control signals 66. In some embodiments, the reference clock signals 64 may include an input in-phase clock signal 68 aligned with (e.g., nearly aligned with) a reference phase value (e.g., 0°, nearly 0°) and an input quadrature-phase clock signal 70 being 90° (e.g., nearly 90°) out-of-phase compared to the input in-phase clock signal 68. In alternative or additional embodiments, the reference clock signals 64 may additionally include an input negative in-phase clock signal 72 being 180° (e.g., nearly 180°) out-of-phase compared to the input in-phase clock signal 68, and an input negative quadrature-phase clock signal 74 being 270° (e.g., nearly 270°) out-of-phase compared to the input in-phase clock signal 68.

In the depicted embodiment, the phase interpolator 58 may receive the reference clock signals 64 including the input clock signals 68, 70, 72, and 74 discussed above. However, it should be appreciated that in alternative or additional embodiments, the phase interpolator 58 may receive the reference clock signals 64 including any other viable number of clock signals. For example, the phase interpolator 58 may receive the reference clock signals 64 including (e.g., only including) the input clock signals 68 and 70. Alternatively or additionally, the phase interpolator 58 may receive the reference clock signals 64 including clock signals having any other viable phase values, phase differences between the respective phase values, or both.

In some embodiments, a clock generation device (not shown) may generate the reference clock signals 64. The clock generation device may include an oscillator (e.g., a crystal oscillator) that may generate a signal with a reference oscillation frequency. The electronic device 10 may include the clock generation device. For example, the clock circuitry 28 may receive the reference clock signals 64 from the clock generation device. In specific embodiments, the clock circuitry 28 may include the clock generation device.

As mentioned above, the phase interpolator 58 may receive the reference clock signals 64 and the control signals 66. The control signals 66 may be indicative of a desired phase value of the output clock signal 62. In some cases, the control signals 66 may select one or more (e.g., a subset of) of the input clock signals 68, 70, 72, and 74 and/or indicate weighting factors of each of the input clock signals 68, 70, 72, and 74.

The phase interpolator 58 may generate the output clock signal 62 with the desired phase value based on the selection and/or the weighting factors of the input clock signals 68, 70, 72, and 74. In particular, the phase interpolator 58 may combine (e.g., mix, multiply) each of the input clock signals 68, 70, 72, and 74 based on the selection and/or the weighting factors of each of the input clock signals 68, 70, 72, and 74 to generate the output clock signal 62 with the desired phase value.

The phase interpolator 58 may include multiplication circuits or mixers to combine (e.g., mix, multiply) the input clock signals 68, 70, 72, and 74 based on the control signals 66. As such, the phase interpolator 58 may generate the output clock signal 62 (e.g., a single output clock signal) having the desired phase value. In some cases, the desired phase value of the output clock signal 62 may be equal to a phase value of one of the input clock signals 68, 70, 72, and 74. Alternatively, the desired phase value of the output clock signal 62 may be an intermediary phase value between the phase values of the input clock signals 68, 70, 72, and 74.

In some embodiments, the processor core complex 18 of the electronic device 10 discussed above may generate the control signals 66. It should be appreciated that any other viable component may generate the control signals 66. In specific embodiments, the input devices 14 of the electronic device 10 discussed above, the I/O ports 16, the processor core complex 18, the network interface 24, the memory 20, the storage device 22, or any combination thereof, among other things, may receive and/or output the control signals 66. As such, the phase interpolator 58 may be coupled to the processor core complex 18, the input devices 14 of the electronic device 10 discussed above, the I/O ports 16, the processor core complex 18, the network interface 24, the memory 20, the storage device 22, or any combination thereof, among other things. In any case, the phase interpolator 58 may output the output clock signal 62 to the phase correction circuit 60.

In some cases, if not compensated for, a phase value of the output clock signal 62 may be undesirably distorted. For example, variations in process (e.g., manufacturing process), voltage, and/or temperature of the phase interpolator 58, or the electronic device 10 including the phase interpolator 58, may undesirably distort the phase value of the output clock signal 62. The phase correction circuit 60 may compensate for at least a portion of the undesired distortions, as discussed herein.

The phase correction circuit 60 may include a storage device 76 and a programmable delay circuit 78 (e.g., a programmable clock skew buffer). The phase correction circuit 60 may receive the output clock signal 62 and the control signals 66. In some embodiments, the storage device 76 may be coupled to the processor core complex 18, the input devices 14 of the electronic device 10 discussed above, the I/O ports 16, the processor core complex 18, the network interface 24, the memory 20, the storage device 22, or any combination thereof, among other things, to receive the control signals 66. As such, the storage device 76 may receive the control signals 66. In some embodiments, the phase correction circuit 60 may be coupled to an output of the phase interpolator 58. The programmable delay circuit 78 may receive the output clock signal 62.

The storage device 76 may include a volatile or non-volatile storage. In some embodiments, the memory 20 and/or the storage devices 22 of the electronic device 10 discussed above may include at least a portion of the storage device 76. The storage device 76 may store data associated with multiple delay values (e.g., 0.001 Nano-second (Ns), 0.007 Ns, 0.01 Ns, 0.03 Ns, 0.1 Ns, and so on, among other possibilities) to compensate for the undesired distortions associated with the desired phase value of the output clock signal 62. For example, the storage device 76 may store multiple delay values associated with different desired phase values. Moreover, the control signals 66 may correspond to a respective delay value of the data stored in the storage device 76.

In some embodiments, the delay values may be determined (e.g., predetermined) during manufacturing of the electronic device 10, the clock circuitry 28, and/or the phase interpolator 58. In alternative or additional embodiments, the delay values may be determined by calibration of the phase interpolator 58 after manufacturing. In specific cases, the electronic device 10 may dynamically determine the delay values based on receiving clock calibration instructions, based on a defined (e.g., pre-set) time interval, based on detecting a change in voltage and/or temperature of the phase interpolator 58 higher than a threshold, among other things. For example, the electronic device 10 may include one or more sensors (e.g., temperature sensors, voltage level sensors) detecting the change.

The storage device 76 may store a lookup table 77 storing the data associated with the multiple delay values. For example, a first portion of the data may be associated with a first delay value to compensate for an undesired distortion of a first desired phase value based on first control signals 66. Moreover, a second portion of the data may be associated with a second delay value to compensate for an undesired distortion of a second desired phase value based on second control signals 66.

The lookup table 77 may store the data associated with any number of delay values to compensate for an undesired distortion of a respective number of desired phase values based on receiving respective control signals 66. For example, the delay values may include 10°, 25°, 45°, 65°, 87°, and so on, among other possibilities. In some cases, the number of the delay values stored in the lookup table 77 (or the storage device 76) may correspond to a granularity level for compensating for the undesired distortions of the desired phase value of the output clock signal 62.

As such, storing the data associated with an increased number of the delay values in the lookup table may compensate for the undesired distortion of an increased number of desired phase values based on receiving the respective control signals 66. For example, the delay values may include 5°, 8°, 10°, 14°, 21°, 25°, 29°, 31°, 35°, 40°, 45°, 49°, 53°, 61°, 65°, 75°, 87°, and so on, among other possibilities. Accordingly, increasing the number of the delay values stored in the lookup table 77 may increase the granularity level of the delay values for compensating for the undesired distortions of the desired phase value based on the control signals 66.

In any case, the storage device 76 may output delay signals 80 to the programmable delay circuit 78. The storage device 76 may output the delay signals 80 based on the stored data and receiving the control signals 66. As discussed above, the stored data may include the lookup table 77 and/or the delay values. Moreover, the phase interpolator 58 may output the output clock signal 62 to the programmable delay circuit 78 based on receiving the control signals 66. In some cases, if not compensated for, the output clock signal 62 may be undesirably distorted. The programmable delay circuit 78 may compensate for at least a portion of the undesired distortions of the output clock signal 62 based on the delay signals 80.

The programmable delay circuit 78 may include a buffer 82 and a programmable clock skew circuit 84. The buffer 82 may receive the output clock signal 62. In some embodiments, the buffer 82 may include an amplifier circuit, among other things. The buffer 82 may output the output clock signal 62. The programmable clock skew circuit 84 may receive the output clock signal 62. In the depicted embodiment, the programmable clock skew circuit 84 may include programmable capacitors 86-1 to 86-N that are coupled to an output of the buffer 82 and a ground connection.

The programmable clock skew circuit 84 may include any suitable number of programmable capacitors 86-1 to 86-N (e.g., switched capacitors, loading capacitors, among other possibilities). In some embodiments, the capacitance values of the programmable capacitors 86-1 to 86-N may at least partially correspond to a delay value for adjusting the output clock signal 62. As such, the programmable clock skew circuit 84 may output the output clock signal 62 with a delay value based on the capacitance values of the programmable capacitors 86-1 to 86-N.

In alternative or additional embodiments, the buffer 82 may include a number of switches. The switches may open and close to adjust a resistance of the buffer 82. In such embodiments, an adjustable resistance value of the buffer 82 may at least partially correspond to the delay value for adjusting the output clock signal 62. Accordingly, the programmable clock skew circuit 84 may output the output clock signal 62 with a delay value based on the capacitance values of the programmable capacitors 86-1 to 86-N, the resistance of the buffer 82, as adjusted by the number of switches, or both.

In the depicted embodiment, the programmable capacitors 86-1 to 86-N may receive the delay signals 80. The delay signals 80 may be indicative of the capacitance values of the programmable capacitors 86-1 to 86-N. In different embodiments, each of the programmable capacitors 86-1 to 86-N may have a different capacitance value. Each of the programmable capacitors 86-1 to 86-N may adjust (e.g., delay) the output clock signal 62 by a respective delay value based on a respective capacitance value. One or more of the programmable capacitors 86-1 to 86-N may be switchable to open (e.g., disconnect) or close (e.g., connect). As such, the delay signals 80 may open and/or close the one or more of the programmable capacitors 86-1 to 86-N.

Alternatively or additionally, one or more of the programmable capacitors 86-1 to 86-N may have multiple programmable capacitance values. Accordingly, the delay signals 80 may adjust the capacitance value of the one or more of the programmable capacitors 86-1 to 86-N. Moreover, as discussed above, the storage device 76 may output the delay signals 80 based on the control signals 66 to adjust respective capacitance values of the programmable capacitors 86-1 to 86-N.

As such, the storage device 76 may output the delay signals 80 to adjust (e.g., delay) the output clock signal 62 by a respective delay value based on adjusting the respective capacitance values of the programmable capacitors 86-1 to 86-N. In some cases, the programmable capacitors 86-1 to 86-N may compensate for at least a portion of the undesired distortions of the output clock signal 62. Accordingly, the phase correction circuit 60 (and/or the clock circuitry 28) may output the output clock signal 62 with the desired phase value, as adjusted, with improved phase accuracy (e.g., even-stepped phase generation).

Figure 7:
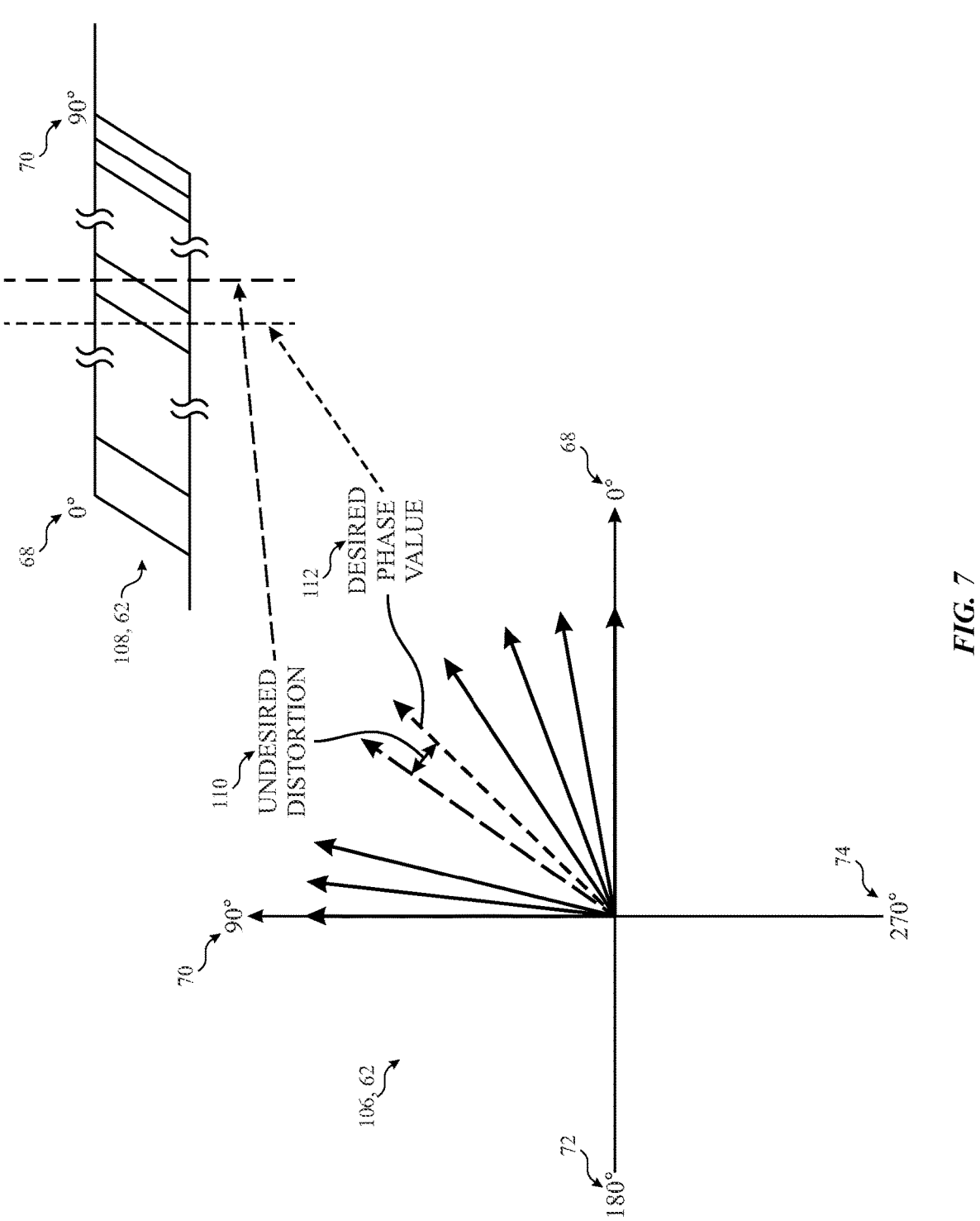
FIG. 7 is a phase vector plot and a transient plot illustrating an example of an undesired distortion and the desired phase value of the output clock signal of FIG. 6, according to embodiments of the present disclosure.

FIG. 7 is a phase vector plot 106 and a transient plot 108 illustrating an example of an undesired phase distortion 110 and a desired phase value 112 of the output clock signal 62, according to embodiments of the present disclosure. The phase vector plot 106 may illustrate the reference clock signals 64 and the respective phase values. The reference clock signals 64 may include the input in-phase clock signal 68 having 0° reference phase value, the input quadrature-phase clock signal 70 having 90° reference phase value, the input negative in-phase clock signal 72 having 180° reference phase value, and the input negative quadrature-phase clock signal 74 having 270° reference phase value. The transient plot 108 may illustrate the input in-phase clock signal 68 and the input quadrature-phase clock signal 70.

In the depicted embodiment, the desired phase value 112 may be between the input in-phase clock signal 68 having 0° reference phase value and the input quadrature-phase clock signal 70 having 90°. For example, the desired phase value 112 may be 5°, 10°, 14°, 28°, 34°, 45°, 55°, 70°, 82°, 85°, and so on, among other possibilities. It should be appreciated that the desired phase value 112 is shown by the way of example for illustration purposes. For example, in alternative or additional cases, the desired phase value 112 may be 0°, 90°, 180°, 270°, between 90° and 180°, 180° and 270°, or 270° and 0°. Alternatively or additionally, the phase vector plot 106 may include the reference clock signals 64 including clock signals having any other viable phase values, phase differences between the respective phase values, or both.

In some cases, the control signals 66 may select one or more of the input clock signals 68, 70, 72, and 74 and/or indicate weighting factors of each of the input clock signals 68, 70, 72, and 74. As mentioned above, the phase interpolator 58 may generate the output clock signal 62 with the desired phase value 112 based on the selection and/or the weighting factors of the input clock signals 68, 70, 72, and 74. In the depicted embodiment, the phase interpolator 58 may combine (e.g., mix, multiply) the input in-phase clock signal 68 and the input quadrature-phase clock signal 70. For example, the control signals 66 may indicate selecting the clock signals 68 and 70. Alternatively or additionally, the control signals 66 may indicate weighting factors of higher than zero (e.g., 0.1, 0.22, 0.39, 0.5, 0.76, 0.89, 1) for the clock signals 68 and 70 and a weighting factor of zero (e.g., near zero) for the input clock signals 72 and 74.

As discussed above, in some cases, if not compensated for, the output clock signal 62 may have the undesired phase distortion 110. The undesired phase distortion 110 may correspond to a phase difference between the desired phase value 112 and a phase of the output clock signal 62 generated by the phase interpolator 58. In some cases, variations in process (e.g., manufacturing process), voltage, and/or temperature of the phase interpolator 58, or the electronic device 10 including the phase interpolator 58, may undesirably cause the undesired phase distortion 110. In any case, the phase correction circuit 60 may adjust (e.g., delay) the output clock signal 62 to improve an accuracy of the desired phase value and/or linearity of the output clock signal 62. Accordingly, the phase correction circuit 60 (and/or the clock circuitry 28) may output the output clock signal 62 with the desired phase value 112, as shown in the phase vector plot 106 and the transient plot 108, with improved phase accuracy.

Figure 8:
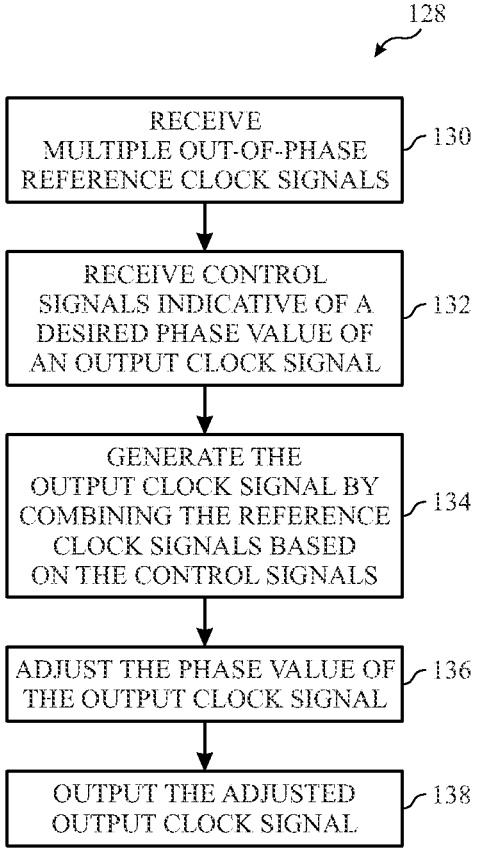
FIG. 8 is a process flow diagram illustrating a process for generating the output clock signal of FIGS. 6 and 7 with the desired phase value, according to embodiments of the present disclosure.

FIG. 8 is a process flow diagram illustrating a process 128 for generating the output clock signal 62 with a desired phase value, according to embodiments of the present disclosure. Although the following description of the process

128 is described with reference to the clock circuitry 28 of the electronic device 10, it should be noted that the process 128 may be performed by one or more other clock circuits disposed on other devices that may be capable of generating an output clock signal with a desired oscillation frequency and desired phase value. Additionally, although the following process 128 describes a number of operations that may be performed, it should be noted that the process 128 may be performed in a variety of suitable orders and all of the operations may not be performed.

In some embodiments, the process 128 may be implemented as processor-executable code included with the storage device 76 of the phase correction circuit 60. For example, the clock circuitry 28 and/or the storage device 76 may include non-transitory, computer-readable media (e.g., any suitable form of memory or storage) that may store the processor-executable code used by the clock circuitry 28 (e.g., processing circuitry), the processor core complex 18 (e.g., the processing circuitry), or any other viable circuit component to perform the presently disclosed techniques. It should be noted that non-transitory merely indicates that the media is tangible and not a signal.

At block 130, the clock circuitry 28 may receive multiple reference clock signals 64. The reference clock signals 64 may be out-of-phase. In some embodiments, the reference clock signals 64 may include the clock signals 68, 70, 72, and 74. At block 132, the clock circuitry 28 may receive the control signals 66 indicative of a desired phase value of the output clock signal 62. In some embodiments, the desired phase value may be 0°, 90°, 180°, 270°, between 0° and 90°, 90° and 180°, 180° and 270°, or 270° and 0°.

At block 134, the clock circuitry 28 may generate the output clock signal 62 by combining (e.g., mixing, multiplying) the reference clock signals 64 based on the control signals 66. For example, the clock circuitry 28 may combine the reference clock signals 64 based on a selection and/or weighting factors of each of the reference clock signals 64 as indicated by the control signals 66. In any case, as mentioned above, in some cases, if not compensated for, the output clock signal 62 may have undesired distortions. As such, at block 136, the clock circuitry 28 may adjust the phase value of the output clock signal 62. Accordingly, at block 138, the clock circuitry 28 may output the output clock signal 62, as adjusted, to one or more other components. For example, the clock circuitry 28 may output the output clock signal 62 to the processor core complex 18, the input devices 14, the I/O ports 16, the network interface 24, the memory 20, the storage device 22, or any combination thereof, among other things.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A clock circuit comprising:

a phase interpolator configured to generate an output clock signal based on control signals;

a programmable clock skew circuit coupled to the phase interpolator, wherein the programmable clock skew circuit is configured to adjust the output clock signal based on a delay value to compensate for at least a portion of a distortion of the output clock signal, and wherein the programmable clock skew circuit is configured to output the output clock signal, as adjusted, with a desired phase value; and a storage device configured to store a lookup table comprising a plurality of delay values, wherein each delay value of the plurality of delay values is associated with a respective desired phase value, and wherein the storage device is configured to output an indication of the delay value of the plurality of delay values to the programmable clock skew circuit based on the control signals.

2. The clock circuit of claim 1, wherein the control signals are indicative of the desired phase value of the output clock signal.

3. The clock circuit of claim 1, wherein the phase interpolator is configured to receive a plurality of reference clock signals.

4. The clock circuit of claim 3, wherein the control signals are indicative of a selection, a weighting factor, or both, associated with each reference clock signal of a subset of the plurality of reference clock signals, wherein the phase interpolator is configured to combine the subset of the plurality of reference clock signals based on the respective selections, the respective weighting factors, or both.

5. The clock circuit of claim 3, wherein the plurality of reference clock signals comprise an input in-phase clock signal, an input quadrature-phase clock signal, an input negative in-phase clock signal, and an input negative quadrature-phase clock signal.

6. The clock circuit of claim 5, wherein the input in-phase clock signal is associated with 0° based on a reference phase value, the input quadrature-phase clock signal is associated with 90° based on the reference phase value, the input negative in-phase clock signal is associated with 180° based on the reference phase value, and the input negative quadrature-phase clock signal is associated with 270° based on the reference phase value.

7. The clock circuit of claim 1, comprising a buffer coupled to the phase interpolator and the programmable clock skew circuit.

8. The clock circuit of claim 1, wherein the programmable clock skew circuit comprises one or more programmable capacitors, wherein the one or more programmable capacitors are configured to adjust the output clock signal based on the delay value, wherein a capacitance value of the one or more programmable capacitors is configured to correspond to the delay value, wherein the storage device is configured to adjust a capacitance value of at least one of the one or more programmable capacitors by outputting the indication of the delay value.

9. The clock circuit of claim 1, wherein the delay value is associated with correcting a phase difference between the desired phase value and a phase of the output clock signal generated by the phase interpolator.

10. An electronic device comprising:

a processor core complex configured to generate first control signals, wherein the first control signals are indicative of a first desired phase value of an output clock signal; and a clock circuit coupled to the processor core complex, comprising:

a phase interpolator configured to generate the output clock signal based on the first control signals; and a programmable clock skew circuit coupled to the phase interpolator, wherein the programmable clock skew circuit comprises one or more programmable capacitors, the one or more programmable capacitors being configured to adjust a phase of the output clock signal based on a first delay value to compensate for at least a portion of a distortion of the output clock signal, wherein the first delay value corresponds to a first capacitance value of at least one of the one or more programmable capacitors, and wherein the programmable clock skew circuit is configured to output the output clock signal, as adjusted, with the first desired phase value.

11. The electronic device of claim 10, wherein the phase interpolator is configured to receive a plurality of reference clock signals, wherein the first control signals are indicative of a selection, a weighting factor, or both, associated with each reference clock signal of a subset of the plurality of reference clock signals, wherein the phase interpolator is configured to combine the subset of the plurality of reference clock signals based on the respective selections, the respective weighting factors, or both.

12. The electronic device of claim 10, wherein the clock circuit comprises a storage device configured to store a plurality of delay values, wherein the storage device is configured to output an indication of the first delay value of the plurality of delay values to the programmable clock skew circuit based on the first control signals.

13. The electronic device of claim 12, wherein the storage device is configured to store a lookup table comprising the plurality of delay values, wherein the first control signals correspond to the first delay value of the plurality of delay values, wherein the storage device is configured to adjust a capacitance value of at least one of the one or more programmable capacitors by outputting the indication of the first delay value.

14. The electronic device of claim 12, wherein the processor core complex is configured to generate second control signals indicative of a second desired phase value of the output clock signal, wherein the one or more programmable capacitors are configured to adjust the phase of the output clock signal based on a second delay value, wherein the programmable clock skew circuit is configured to output the output clock signal, as adjusted, with the second desired phase value, and wherein the storage device is configured to output an indication of the second delay value of the plurality of delay values to the programmable clock skew circuit based on the second control signals.

15. Tangible, non-transitory, computer-readable media storing instructions that, when executed by processing circuitry, cause the processing circuitry to:

receive a plurality of reference clock signals;

receive control signals indicative of a desired phase value of an output clock signal;

generate the output clock signal by combining a subset of the plurality of reference clock signals based on the control signals;

determine a delay value based on the control signals via a lookup table comprising a plurality of delay values;

adjust a phase value of the output clock signal based on the delay value to compensate for at least a portion of a distortion of the output clock signal; and output the output clock signal, as adjusted, with the desired phase value.

16. The tangible, non-transitory, computer-readable media of claim 15, wherein the instructions cause the processing circuitry to adjust a capacitance value of a programmable clock skew circuit based on the delay value, and to adjust the phase value of the output clock signal based on the capacitance value of the programmable clock skew circuit.

17. The tangible, non-transitory, computer-readable media of claim 16, wherein the capacitance value of the programmable clock skew circuit, as adjusted, corresponds to the delay value.

18. The tangible, non-transitory, computer-readable media of claim 15, wherein the delay value is associated with correcting a phase difference between the desired phase value and a phase of the output clock signal generated by a phase interpolator.

19. The tangible, non-transitory, computer-readable media of claim 15, wherein the control signals are indicative of a selection, a weighting factor, or both, associated with each reference clock signal of the subset of the plurality of reference clock signals, wherein the instructions cause the processing circuitry to combine the subset of the plurality of reference clock signals based on the respective selections, the respective weighting factors, or both.

20. The tangible, non-transitory, computer-readable media of claim 15, wherein the plurality of reference clock signals comprise an input in-phase clock signal, an input quadrature- phase clock signal, an input negative in-phase clock signal, and an input negative quadrature-phase clock signal.

\* \* \* \* \*